United States Patent
Kim et al.

(10) Patent No.: US 12,448,544 B2
(45) Date of Patent: Oct. 21, 2025

(54) CHEMICAL MECHANICAL POLISHING COMPOSITIONS AND METHODS OF USE THEREOF

(71) Applicant: FUJIMI INCORPORATED, Aichi (JP)

(72) Inventors: Hooi-Sung Kim, Lake Oswego, OR (US); Shogo Onishi, Tigard, OR (US)

(73) Assignee: FUJIMI INCORPORATED, Aichi (JP)

( * ) Notice: Subject to any disclaimer, the term of this patent is extended or adjusted under 35 U.S.C. 154(b) by 246 days.

(21) Appl. No.: 18/111,369

(22) Filed: Feb. 17, 2023

(65) Prior Publication Data

US 2023/0295465 A1   Sep. 21, 2023

Related U.S. Application Data

(60) Provisional application No. 63/320,382, filed on Mar. 16, 2022.

(51) Int. Cl.
| | |
|---|---|
| C09G 1/02 | (2006.01) |
| C09G 1/16 | (2006.01) |
| H01L 21/304 | (2006.01) |
| H01L 21/306 | (2006.01) |
| H01L 21/321 | (2006.01) |

(52) U.S. Cl.
CPC .............. C09G 1/02 (2013.01); C09G 1/16 (2013.01); H01L 21/304 (2013.01); H01L 21/30625 (2013.01); H01L 21/3212 (2013.01)

(58) Field of Classification Search
None
See application file for complete search history.

(56) References Cited

U.S. PATENT DOCUMENTS

| | | | |
|---|---|---|---|
| 10,040,971 B2 | 8/2018 | Hoshi et al. | |
| 10,138,396 B2 | 11/2018 | Yoshizaki et al. | |
| 10,418,248 B2 | 9/2019 | Petro et al. | |
| 2008/0289261 A1 | 11/2008 | Hattori et al. | |
| 2010/0167547 A1* | 7/2010 | Kamimura | H01L 21/31053 438/693 |
| 2019/0256742 A1* | 8/2019 | Suzuki | B24B 37/00 |

FOREIGN PATENT DOCUMENTS

JP    2019512866 A    5/2019

OTHER PUBLICATIONS

Cano-Serrano et al., "Sulfonic acid-functionalized silica through quantitative oxidation of thiol groups," Chem. Commun., 2003, 2:246-247.
Kazuo et al., "Novel Silane Coupling Agents Containing a Photolabile 2-Nitrobenzyl Ester for Introduction of a Carboxy Group on the Surface of Silica Gel," Chemistry Letters, 2000, 29(3):228-229.

* cited by examiner

*Primary Examiner* — Stephanie P Duclair
(74) *Attorney, Agent, or Firm* — KATTEN MUCHIN ROSENMAN LLP

(57) ABSTRACT

The present disclosure relates to chemical mechanical polishing (CMP) compositions for polishing molybdenum surfaces. In particular, the CMP composition includes an abrasive, a molybdenum (Mo) etching inhibitor, an oxidizer, and water, combined in specified amounts to provide a composition with advantageous properties such as high Mo:TEOS removal rate selectivity and/or high Mo:SiN removal rate selectivity.

20 Claims, No Drawings

CHEMICAL MECHANICAL POLISHING COMPOSITIONS AND METHODS OF USE THEREOF

TECHNICAL FIELD

The present disclosure relates to chemical mechanical polishing (CMP) compositions comprising a zwitterionic surfactant as a molybdenum etching inhibitor. More particularly, the polishing compositions does not contain any iron ions and comprises an abrasive, a molybdenum (Mo) etching inhibitor, an oxidizer, and water, combined in specified amounts to provide a composition with advantageous properties such as high molybdenum (Mo):TEOS removal rate selectivity and/or high Mo:SiN removal selectivity, thus providing compositions well suited for polishing a molybdenum surface.

BACKGROUND

CMP is a process in which material is removed from a surface of a substrate (such as a semiconductor wafer) and the surface is polished (planarized) by coupling a physical process, such as abrasion, with a chemical process, such as oxidation or chelation. In its most rudimentary form, CMP involves applying a slurry to the surface of the substrate or a polishing pad that polishes the substrate. This process achieves both the removal of unwanted material and planarization of the surface of the substrate. It is not desirable for the removal or polishing process to be purely physical or purely chemical, but rather comprise a synergistic combination of both.

CMP is used on a large variety of objects, examples of which include silicon dioxide ($SiO_2$) in inter-layer or buried dielectrics; metals such as aluminum (Al), copper (Cu), and tungsten (W) in wiring layers or plugs connecting to such a wiring layer; a barrier metal layer such as tantalum (Ta), tantalum nitride (TaN), and titanium (Ti); polysilicon for use as a trench capacitor; and molybdenum, which is used in a wide range of applications.

Molybdenum may be used in a variety of industrial applications, including microelectronic devices such as connectors, photo masks, and semiconductor device manufacture. In such applications, molybdenum is often initially utilized in an excess amount. This requires that some molybdenum must be removed in order to provide a substrate with suitable surface properties.

When polishing a molybdenum-containing substrate, the CMP process is typically carried out in a two-step sequence. The first step is specifically designed to rapidly remove interconnected metal material from the surface of a substrate. The second step removes the barrier layer, while attempting to not adversely affect the physical structure or electrical properties of the interconnected metal structure. During removal of the barrier layer, the underlying layer may also be removed. This underlying layer is often a silicon oxide-containing material, such as tetraethyl orthosilicate (TEOS). Unfortunately, polishing compositions that remove silicon oxide-containing materials at rapid removal rates tend additionally to remove underlying masks, caps, anti-reflective coatings, and dielectrics at unacceptable removal rates. The uncontrolled removal of these underlying masks, caps, anti-reflective coatings, and dielectrics has a detrimental impact upon the ultimate performance of semiconductors.

Accordingly, the polishing of semiconductors requires selective removal of molybdenum in comparison to other materials, such as silicon oxide-containing material. However, current polishing compositions for use with molybdenum require the use of a low polishing speed or heat. These limitations prolong the polishing process and lower the throughput of the process when using CMP. Thus, polishing compositions currently used in CMP have issues such as high oxide polishing speeds, low Mo:TEOS removal rate ratios, low Mo:SiN removal rate ratios and scratches on the surface of polished substrates.

In light of the challenges surrounding selective polishing of molybdenum-containing substrates, it is critical to identify polishing compositions enabling a high molybdenum removal rate while simultaneously enabling a low TEOS removal rate and/or a low SiN removal rate thereby resulting in a high Mo:TEOS and/or high Mo:SiN removal rate selectivity. These and other challenges are addressed by the subject matter disclosed herein.

SUMMARY

In accordance with the purpose(s) of the currently disclosed subject matter or problems to be solved by the invention, as embodied and broadly described herein, it is an object of the present invention to provide a composition for polishing substrates, such as those containing molybdenum, that facilitate improvement in polishing speeds when using CMP. Another object of the present invention is to provide a method for selective removal of a material from a substrate, such as molybdenum. In some embodiments, the disclosed polishing composition does not contain any iron ions.

Accordingly, the presently disclosed subject matter in one aspect relates to a polishing composition comprising an abrasive, a molybdenum etching inhibitor, an oxidizer, and water, wherein the abrasive is colloidal silica with a mean particle size ranging from about 30 to about 75 nm and a silanol density on the silica surface ranging from about 1.3 to about 6.0 unit/$nm^2$;

the molybdenum etching inhibitor is a zwitterionic surfactant having a structure of formula (I):

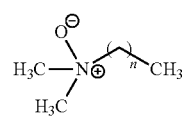

Formula (I)

wherein n is an integer selected from 8, 9, 10, 11, 12, 13, and 14; and the oxidizer is a peroxide;

wherein the polishing composition has a pH from about 6.5 to about 8.5.

In another aspect, the subject matter described herein is directed to a method for polishing a substrate, the method comprising the steps of: 1) providing the polishing composition as disclosed herein; 2) providing a substrate, wherein the substrate comprises a molybdenum-containing layer; and 3) polishing the substrate with the polishing composition to provide a polished substrate.

DETAILED DESCRIPTION

The present invention can be understood more readily by reference to the following detailed description of the invention and the examples included therein.

Before the present compounds, compositions, articles, systems, devices, and/or methods are disclosed and described, it is to be understood that they are not limited to specific synthetic methods unless otherwise specified, or to particular components unless otherwise specified, as such may, of course, vary. It is also to be understood that the terminology used herein is for describing particular aspects only, and is not intended to be limiting. Although, any methods and materials that are similar or equivalent to those described herein can be used in the practice or testing of the present invention, example methods and materials are now described.

Described herein are polishing compositions comprising an abrasive, a molybdenum etching inhibitor, an oxidizer, and water. These polishing compositions are intended for polishing a substrate where the polishing compositions exhibit at least one benefit such as: 1) a low molybdenum etching rate (ER); 2) a high molybdenum removal rate (RR); 3) a low TEOS removal rate; 4) a low SiN removal rate; 5) high Mo:TEOS removal rate selectivity; 6) high Mo:SiN removal rate; 7) high Mo (RR):Mo (ER) ratio; 8) a low tungsten (W) etching rate (ER); 9) a high tungsten removal rate (RR); 10) high composition stability; 11) high W:TEOS removal rate selectivity; 12) high W:SiN removal rate; and 13) high W (RR):W (ER) ratio. Furthermore, these polishing compositions do not contain any iron source, including iron salts.

The molybdenum static etching rate, tungsten static etching rate, molybdenum removal rate, tungsten removal rate, TEOS removal rate, SiN removal rate, composition stability, Mo:TEOS removal rate selectivity, W:TEOS removal rate selectivity, Mo:SiN removal rate selectivity, and W:SiN removal rate selectivity of the polishing compositions described herein are key properties. Compositions exhibiting these key properties may be obtained by use of specific components in requisite amounts. For example, in an embodiment, a polishing composition comprising an abrasive, a molybdenum etching inhibitor, an oxidizer, and water has been found to provide a high Mo:TEOS removal rate selectivity and/or high Mo:SiN removal selectivity, wherein the concentrations of each component of the polishing composition must be present in specific amounts to provide a high rate of Mo removal and a low rate of TEOS removal and/or SiN removal.

The polishing compositions described herein have uses such as, but not limited to, the CMP of molybdenum-containing substrates and/or tungsten-containing substrates.

A. Definitions

Listed below are definitions of various terms used to describe this invention. These definitions apply to the terms as they are used throughout this specification, unless otherwise limited in specific instances, either individually or as part of a larger group.

As used in the specification and the appended claims, the singular forms "a," "an" and "the" include plural referents unless the context clearly dictates otherwise. Thus, for example, reference to "an abrasive" or "a pH-adjusting agent" includes mixtures of two or more such abrasives or pH-adjusting agents.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It will also be understood that there are a number of values disclosed herein, and that each value is herein disclosed as "about" that particular value in addition to the value itself. For example, if the value "10" is disclosed, then "about 10" is also disclosed. It will also be understood that each unit between two particular units is also disclosed. For example, if 10 and 15 are disclosed, then 11, 12, 13, and 14 are also disclosed.

References in the specification and concluding claims to parts by weight of a particular element or component in a composition denote the weight relationship between the element or component and any other elements or components in the composition or article for which a part by weight is expressed. Thus, in a compound containing 2 parts by weight of component "X" and 5 parts by weight of component "Y," "X and Y" are present at a weight ratio of 2:5, and are present in such ratio regardless of whether additional components are contained in the compositions.

A weight percent (wt %) of a component, unless specifically stated to the contrary, is based on the total weight of the vehicle or composition in which the component is included.

As used herein, the terms "optional" and "optionally" mean that the subsequently described event or circumstance can or cannot occur, and that the description includes instances where said event or circumstance occurs and instances where it does not.

B. Polishing Composition

The fundamental mechanism of CMP is to soften a surface layer by chemical reaction and then remove the softened layer by mechanical force with abrasive particles. However, the role of CMP is not only material removal, but also planarization, surface smoothening, uniformity control, defect reduction and more. Semiconductor yield enhancement is thus influenced by CMP processing. Surface scratching, which can be generated by CMP, is an extremely detrimental defect in semiconductor manufacturing. Hence, to achieve proper CMP performance without surface scratching, development of polishing compositions is crucially important. Requirements for CMP include planarized surfaces with planarity <15 nm, roughness-free surfaces with surface roughness <1 nm, defect-free surfaces with scratch and pit counts of 0 counts per wafer, are contamination free, have a high productivity, and are planarized with a high removal rate of the desired material to be removed.

In polishing compositions for use with molybdenum (Mo) and TEOS-containing substrates, one key performance metric is a high Mo:TEOS removal rate selectivity, which provides minimal TEOS removal. Likewise, polishing compositions for use with Mo and SiN-containing substrates also require high Mo:SiN removal rate selectivity (which provides minimal SiN removal) as a key performance metric. Polishing compositions with high Mo:TEOS selectivity and/or high Mo:SiN selectivity are ideally formulated at pH=6.2-9.2. These and other aspects will be discussed further herein.

In polishing compositions for use with tungsten (W) and TEOS-containing substrates or SiN-containing substrates, key performance metrics include high W:TEOS removal rate selectivity (which provides minimal TEOS removal) and/or high W:SiN removal rate selectivity (which provides minimal SiN removal). Polishing compositions with high W:TEOS selectivity and/or high W:SiN selectivity are also ideally formulated at pH=6.2-9.2. These and other aspects will also be discussed further herein.

In light of the complexity surrounding the various mechanisms of Mo, W, TEOS, and SiN removal rates, it is critical to identify compositions enabling a high Mo and/or W removal rate, while simultaneously enabling a low TEOS and/or SiN removal rate, and thus providing high Mo/W: TEOS/SiN removal rate selectivity.

It was surprising and unexpected to discover that the polishing compositions disclosed herein are able to achieve molybdenum (Mo) rates that are just as efficient as Mo polishing compositions that contain iron nitrate and hydrogen peroxide such as disclosed in U.S. Application No. 63/250,837. Hydrogen peroxide is commonly used as an oxidant to increase Mo removal rates but cannot typically achieve Mo removal rates greater than 500 A/min in the absence of iron ions. However, CMP employing iron ion can leave iron residues on the polished surface. By contrast, the polishing compositions disclosed herein were found to exhibit Mo removal rates greater than 500 A/min in the absence of iron ions by using suitable abrasives in combination with an oxidant, such as hydrogen peroxide.

Thus, key aspects of the polishing compositions described herein include, but are not limited to: 1) high Mo and/or W removal rates (RR); 2) low Mo and/or W etching rate (ER); 3) high Mo RR/Mo ER ratio; 4) high W RR/W ER ratio; 5) low TEOS and/or SiN RR; 6) high MoW:TEOS removal rate selectivity; 7) high Mo/W:SiN removal rate selectivity; and 8) a key pH. As described herein, the combination of specific components in specified amounts is key to obtaining these desired properties.

1. Abrasive

The polishing composition described herein contains an abrasive. The abrasive is typically a metal oxide abrasive preferably selected from the group consisting of silica, alumina, titania, zirconia, germania, ceria and mixtures thereof. In some embodiments, the abrasive is silica. In a further embodiment, the abrasive is colloidal silica.

In some embodiments, the abrasive is either a commercial product or a synthetic product. As a method for producing colloidal silica, for example, a sodium silicate method and a sol-gel method can be exemplified, and colloidal silica produced by either method can be used preferably as the abrasive of the present invention. However, in the light of reducing metal impurities, colloidal silica produced by the sol-gel method, which can produce colloidal silica at high purity, is more preferable.

The abrasive can have any suitable particle size. In some embodiments, the grains of the abrasives used in the present invention have an average primary particle size of 10 nm or more and 100 nm or less. In some embodiments, the grains of the abrasives used in the present invention have an average primary particles size of from about 10 nm to about 100 nm, from about 10 nm to about 75 nm, from about 10 nm to about 40 nm, from about 20 nm to about 30 nm, or from about 20 nm to about 25 nm. In some embodiments, the grains of the abrasives used in the present invention have an average primary particles size of from about 12 nm to about 92 nm, from about 12 nm to about 37 nm, from about 23 nm to about 37 nm, or from about 23 nm to about 25 nm.

A lower limit of the average primary particle size of the abrasive grains is preferably 12 nm or more, is more preferably 23 nm or more, and is further preferably 25 nm or more. Further, an upper limit of the average primary particle size of the abrasive grains is preferably less than 92 nm, is more preferably 37 nm or less, and is further preferably 25 nm or less.

Incidentally, the average primary particle sizes of the abrasive grains are measured by an FE-SEM (field emission scanning electron microscope).

The grains of the abrasive can have any suitable mean particle size. For example, the grains of the abrasive can have an average mean particle size of from about 10 nm to about 150 nm, from about 20 nm to about 120 nm, from about 30 nm to about 100 nm, from about 30 nm to about 75 nm, from about 30 nm to about 50 nm, from about 40 nm to about 50 nm, or from about 44 nm to about 48 nm. In some embodiments, the grains of the abrasive can have an average mean particle size of from about 32 nm to about 49 nm.

In some embodiments, the grains of the abrasive can have an average mean particle size of about 10 nm or more, about 25 nm or more, 50 nm or more, or about 100 nm or more. Alternatively, or in addition, the grains of the abrasive can have an average mean particle size of about 150 nm or less, about 120 nm or less, about 100 nm or less, about 75 nm or less, about 50 nm or less, about 49 nm or less, or about 32 nm or less. A particle size analyzer (Horiba Particle Size Distribution tool) can measure the average mean particle size of the abrasive grains.

The abrasive can have any suitable surface area. For example, the abrasive can have an average BET surface area of about 50 $m^2/g$ or more, about 60 $m^2/g$ or more, about 70 $m^2/g$ or more, about 80 $m^2/g$ or more, about 90 $m^2/g$ or more, about 100 $m^2/g$ or more, about 110 $m^2/g$ or more, or about 120 $m^2/g$ or more. Alternatively, or in addition, the abrasive can have an average surface area of about 130 $m^2/g$ or less, about 120 $m^2/g$ or less, about 110 $m^2/g$ or less, about 100 $m^2/g$ or less, about 90 $m^2/g$ or less, about 80 $m^2/g$ or less, about 70 $m^2/g$ or less, about 60 $m^2/g$ or less, more, or about 50 $m^2/g$ or less. In some embodiments, the abrasive can have an average surface area in a range from about 30 $m^2/g$ to about 150 $m^2/g$, from about 40 $m^2/g$ to about 140 $m^2/g$, from about 50 $m^2/g$ about 130 $m^2/g$, from about 60 $m^2/g$ to about 125 $m^2/g$, from about 70 $m^2/g$ to about 120 $m^2/g$, from about 80 $m^2/g$ to about 120 $m^2/g$, from about 90 $m^2/g$ to about 115 $m^2/g$, from about 95 $m^2/g$ to about 110 $m^2/g$, or from about 100 $m^2/g$ to about 110 $m^2/g$.

The silanol group density on the silica surface of the abrasive can vary. In some embodiments, the average silanol group density on the silica surface of the abrasive grains contained in the polishing composition of the present invention is 6.0 $nm^{-2}$ or less. If the average silanol group density is more than 6.0 $nm^{-2}$, hardness of the abrasive grains is low, and the polishing speed is accordingly lowered.

The average silanol group density on the surface of the abrasive grains is preferably 5.7 $nm^{-2}$ or less, is more preferably 5.5 $nm^{-2}$ or less, and is further preferably 1.6 $nm^{-2}$ or less.

In some embodiments, the average silanol group density on the surface of the abrasive grains is from about 1 $nm^{-2}$ to about 6 nm 2, from about 1.3 $nm^{-2}$ to about 6.0 $nm^{-2}$, from about 1.4 $nm^{-2}$ to about 5.7 nm 2, from about 1.4 $nm^{-2}$ to about 5.5 $nm^{-2}$, or from about 1.4 $nm^{-2}$ to about 1.6 nm 2. In some embodiments, the average silanol group density on the surface of the abrasive grains is from about 1 $nm^{-2}$ to about 2 $nm^{-2}$.

Incidentally, a lower limit of the average silanol group density is generally 0.

The number of silanol groups per unit surface area of the abrasive grains can be calculated by the Sears method using neutralization titration described in Analytical Chemistry, vol. 28, No. 12, 1956, 1982 to 1983 by G. W. Sears. The calculation formula for the number of silanol groups is calculated by the following equation.

$$\rho = (c \times a \times N_A)/(C \times S)$$

ρ: Number of silanol groups [count/nm²]
c: Concentration of sodium hydrate solution used in titration [mol/L]
a: Amount of sodium hydrate solution having pH of 4 to 9 added dropwise [ml]
$N_A$: Avogadro's number (6.022×10²³ [count/mol])
C: Mass of silica [g]
S: BET specific surface area [nm²/g]

The number of silanol groups per unit surface area of the abrasive grains can be controlled by selection of the method for producing abrasive grains, or the like.

Moreover, the abrasive grains may be surface-modified as long as their average silanol group density is within the above-described range. In particular, colloidal silica with organic acid immobilized thereto is preferable. Such immobilization of the organic acid to surfaces of the colloidal silica contained in the polishing composition is made by, for example, chemically bonding functional groups of the organic acid with the surfaces of the colloidal silica. The organic acid is not immobilized to the colloidal silica just by allowing the colloidal silica and the organic acid to coexist. If immobilizing sulfonic acid that is a kind of such organic acid to the colloidal silica, for example, a method described in "Sulfonic acid-functionalized silica through quantitative oxidation of thiol groups", *Chem. Commun.* 246-247 (2003) can be adopted. More specifically, by coupling a silane coupling agent having thiol groups such as 3-mercaptopropyltrimethoxysilane with the colloidal silica, and subsequently oxidizing the thiol groups with hydrogen peroxide, the colloidal silica with the sulfonic acid immobilized to its surface can be obtained. Alternatively, if immobilizing carboxylic acid to the colloidal silica, for example, a method described in "Novel Silane Coupling Agents Containing a Photolabile 2-Nitrobenzyl Ester for Introduction of a Carboxy Group on the Surface of Silica Gel", *Chemistry Letters*, 3, 228-229 (2000)" can be adopted. More specifically, by coupling a silane coupling agent containing photolabile 2-nitrobenzyl ester with the colloidal silica and subsequently irradiating the colloidal silica with light, the colloidal silica with carboxylic acid immobilized to its surface can be obtained.

Incidentally, the abrasive grains used in the present Working examples and Comparative Examples are not surface-modified.

The amount of abrasive present in the disclosed polishing composition can vary. In some embodiments, the amount of abrasive in the polishing composition is about 0.01 wt % or more, about 0.05 wt % or more, about 0.1 wt % or more, about 0.2 wt % or more, about 0.25 wt % or more, about 0.5 wt % or more, about 0.75 wt % or more, about 1 wt % or more, about 2 wt % or more, about 3 wt % or more, or about 5 wt % or more. Alternatively, or in addition, the amount of abrasive in the polishing composition can be about 5 wt % or less, about 3 wt % or less, about 2 wt % or less, about 1 wt % or less, about 0.75 wt % or less, about 0.5 wt % or less, about 0.25 wt % or less, about 0.1 wt % or less, about 0.05 wt % or less, about 0.01 wt % or less, or about 0.05 wt % or less. In some embodiments, the amount of abrasive in the polishing composition can be in a range from about 0.01 wt % to about 5 wt %, about 0.05 wt % to about 3 wt %, from about 0.1 wt % to about 2.5 wt %, from about 0.25 wt % to about 2.0 wt %, or from about 0.5 wt % to about 2.0 wt %.

In some embodiments, the amount of abrasive has an effect on the properties of the polishing composition, such as Mo RR, W RR, SiN RR, and TEOS RR. In an embodiment, the amount of abrasive is from about 1.0 wt % to about 3.0 wt %, from about 1.5 wt % to about 2.5 wt %, or from about 1.75 wt % to about 2.25 wt %. In an embodiment, the amount of abrasive is about 2.0 wt % with respect to the entire composition.

While the abrasive can be of any reasonable size, the size of the abrasive influences the smoothness of the finish obtained. Precision polishing operations materials such as optical components, plastics, metals, gemstones, semiconductor components, and the like typically involve the use of abrasives with smaller sizes. For example, compositions for use in connection with precision polishing involve suspensions of abrasives with smaller average particle sizes.

In an embodiment the abrasive is colloidal silica. In some embodiments, the abrasive substantially comprises colloidal silica. As used herein, "substantially" means that 95% by weight or more, preferably 98% by weight or more, more preferably 99% by weight or more of the particles constituting the abrasive are colloidal silica, and it includes that 100% by weight of the particles are colloidal silica.

The abrasive is suspended in the compositions disclosed herein and is colloidally stable. The term colloid refers to the suspension of abrasive particles in the liquid carrier. Colloidal stability refers to the maintenance of the suspension over time. In some embodiments, the suspension is stable for at least 1, 2, 3, 4, 5, 6, or 7 days. In some embodiments, the suspension is stable for at least 1 week, at least 2 weeks, at least 3 weeks, or at least 4 weeks.

In the context of this invention, an abrasive suspension is considered colloidally stable if, when the silica is placed into a 100-mL graduated cylinder and allowed to stand without agitation for a time of two hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the abrasive composition ([C] in terms of g/mL) is less than or equal to 0.5 (i.e., ([B]−[T])/[C]≤0.5). The value of ([B]−[T]/[C]) desirably is less than or equal to 0.3, and preferably is less than or equal to 0.1.

2. Oxidizer

The oxidizer added to the polishing composition has an action of oxidizing the surface of the polishing object and improves the polishing speed of the polishing object by the polishing composition. In some embodiments, the oxidizer is a peroxide. Exemplary peroxides include hydrogen peroxide, sodium peroxide, barium peroxide, and salt thereof. In some embodiments, the oxidizer is hydrogen peroxide.

Additional examples of other oxidizers include, but are not limited to, ozone water, a silver (II) salt, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, persulfuric acid, dichloroisocyanuric acid, and salts thereof. These oxidants may be used either singly or in mixture of two or more kinds thereof.

In some embodiments, the amount of oxidizer has an effect on the properties of the polishing composition, such as Mo RR, W RR, SiN RR, and TEOS RR. As discussed herein, the oxidizer also has an effect on the corrosion of Mo and/or W. The amount of oxidizer may range from about 0.1% to about 10%, from about 0.25% to about 7.5%, from about 0.5% to about 5%, from about 0.5% to about 3%, from about 0.5% to about 2%, from about 0.5% to about 1.5%, or from about 0.75% to about 1.25%. In some embodiments, the oxidizer may range from about 0.001% to about 1%, from about 0.01% to about 0.5%, from about 0.01 to about 0.25%, from about 0.05 to about 0.15%, or about 0.1%. In some embodiments, the oxidizer is present in an amount at about 0.01% or more, about 0.1% or more, about 0.25% or more, about 0.5% or more, about 0.75% or more, about 1.0% or more, or about 1.25% or more. Alternatively, or in addition, the amount of oxidizer is about 5.0% or less, about 3.50% or less, about 2.0% or less, about 1.50% or less, about 1.25% or less, about 1.0% or less, about 0.5% or less, or about 0.1% or less. In some embodiments, the oxidizer is present in an amount of about 0.1% or about 1.0%.

The percentage of oxidizer is measured with respect to the entire composition. Further, the percentage of oxidizer is measured as a Point Of Use (POU) composition. As used herein, the term "point of use" refers to a composition that is prepared and to be used in proximity to the planarization machine that supplies planarization fluid to an individual planarization machine for use in the CMP process.

3. Molybdenum Etching Inhibitor

The polishing composition described herein contains a molybdenum etching inhibitor. In some embodiments, the molybdenum etching inhibitor is a zwitterionic surfactant. As used herein, zwitterionic surfactants (also called amphoteric surfactants) are characterized by having two distinct and opposite charges on the molecule at either adjacent or non-adjacent sites. In some embodiments, the molybdenum etching inhibitor contains an amine oxide functionality (i.e., $-N^+(R_1)(R_2)O^-$, wherein $R_1$ and $R_2$ can be substituted or unsubstituted $C_1$-$C_6$ alkyl groups).

In some embodiments, the molybdenum etching inhibitor is a compound of formula A:

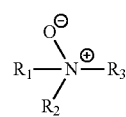

Formula (A)

wherein $R_1$ and $R_2$ are independently selected from substituted or unsubstituted $C_1$-$C_6$ alkyl group; and $R_3$ is selected from substituted or unsubstituted $C_1$-$C_{20}$ alkyl, aryl, heteroaryl, and carbocycle.

In some embodiments, $R_1$ and $R_2$ of the molybdenum etching inhibitor of Formula (A) are independently selected from substituted or unsubstituted $C_1$-$C_6$ alkyl.

In some embodiments, $R_1$ and $R_2$ of the molybdenum etching inhibitor of Formula (A) are independently selected from substituted or unsubstituted methyl, ethyl, and propyl.

In some embodiments, R3 is substituted or unsubstituted $C_1$-$C_{20}$ alkyl.

In some embodiments, the molybdenum etching inhibitor is a zwitterionic surfactant having a structure of formula (I):

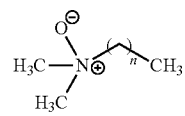

Formula (I)

wherein n is an integer selected from 8, 9, 10, 11, 12, 13, and 14.

In some embodiments, the integer n in formula (I) is selected from 8, 9, 10, 11, and 12. In some embodiments, the integer n in formula (I) is selected from 8, 10, and 12.

Exemplary zwitterionic surfactants of formula (I) are shown in the table below:

| Integer | Structure | Name |
|---|---|---|
| 8 | | Octyl amine oxide |
| 9 | | Nonyl amine oxide |
| 10 | | Decyl amine oxide |
| 11 | | Undecyl amine oxide |
| 12 | | Dodecyl amine oxide |

| Integer | Structure | Name |
|---|---|---|
| 13 | H3C-N+(O-)(CH3)-(CH2)12-CH3 | Tridecyl amine oxide |
| 14 | H3C-N+(O-)(CH3)-(CH2)11-CH3 | Lauryl amine oxide |

In some embodiments, the zwitterionic surfactant is decyl amine oxide. In some embodiments, the zwitterionic surfactant is dodecyl amine oxide. In some embodiments, the zwitterionic surfactant is lauryl amine oxide.

The amount of molybdenum etching inhibitor present in the polishing composition can vary. In some embodiments, the amount of molybdenum etching inhibitor present in the polishing composition is in a range from about 0.01 wt % to about 0.5 wt %, about 0.01 wt % to about 0.25 wt %, from about 0.01 wt % to about 0.15 wt %, from 0.01 wt % to about 0.1 wt %, from about 0.01 wt % to about 0.07 wt %, or from about 0.03 wt % to about 0.07 wt %.

In some embodiments, the molybdenum etching inhibitor is present in an amount of about 0.01 wt % or more, about 0.02 wt % or more, about 0.03 wt % or more, about 0.04 wt % or about 0.05 wt % or more. Alternatively, or in addition, the amount of molybdenum etching inhibitor present in the polishing composition can be about 0.1 wt % or less, about 0.09 wt % or less, about 0.08 wt % or less, about 0.07 wt % or less, or about 0.05 wt % or less. In some embodiments, the amount of amino acid is present in an amount of about 0.05 wt %.

4. pH-Adjusting Agent

The polishing compositions described herein may also contain a pH-adjusting agent. The pH-adjusting agent is not particularly limited. However, the pH of the polishing composition has a direct effect on the effectiveness of the polishing composition.

In some embodiments, the pH adjusting agent is a basic compound. The basic compound may be appropriately selected from various basic compounds that have a function of raising the pH of polishing compositions in which the compounds are dissolved. For example, an inorganic basic compound such as an alkali metal hydroxide, an alkaline earth metal hydroxide, various carbonates, bicarbonates and the like may be used. Such basic compounds may be used singly or in combination of two or more types thereof.

Specific examples of the alkali metal hydroxide include potassium hydroxide, sodium hydroxide, ammonium hydroxide, and the like. Specific examples of the carbonate and bicarbonate include ammonium hydrogen carbonate, ammonium carbonate, potassium hydrogen carbonate, potassium carbonate, sodium hydrogen carbonate, sodium carbonate and the like.

In an alternate embodiments, the pH adjusting agent may be a mixture of an acidic agent and basic agent (such as a buffer). In such embodiments, the acidic agent is not particularly limited provided that the strength of the acid is sufficient to modulate the pH of the polishing composition of the present invention. In some embodiments, the acidic agent may be an inorganic acid or an organic acid. For example, and without limitation, such inorganic acids include hydrochloric acid, sulfuric acid, nitric acid, boric acid, carbonic acid, hypophosphorous acid, phosphorous acid, and phosphoric acid.

For example, and without limitation, such organic acids include formic acid, acetic acid, chloroacetic acid, propionic acid, butanoic acid, valeric acid, 2-methylbutyric acid, N-hexanoic acid, 3,3-dimethylbutanoic acid, 2-ethylbutanoic acid, 4-methylpentanoic acid, n-heptanoic acid, 2-methyl hexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citrate, citric acid, lactic acid, diglycolic acid, 2-furancarboxylic acid, 3-furancarboxylic acid, 2-tetrahydrofurancarboxylic acid, methoxyacetic acid, methoxyphenylacetic acid, and phenoxyacetic acid. Such organic acids also include, without limitation, organic sulfonic acid, such as methanesulfonic acid, ethanesulfonic acid, and isethionic acid.

In an alternate embodiment, the pH adjusting agent may be a buffer containing phosphates, acetates, borates, sulfonates, carboxylates, nitrates and the like. For example, in some embodiments, ammonium salts can be used as a buffer. Such ammonium salts include, but are not limited to, ammonium sulfates, ammonium acetates, and/or ammonium nitrates.

In some embodiments, the pH of the polishing composition is adjusted to a range from about 6.0 to about 9.5, from about 6.2 to about 9.2, from about 6.2 to about 8.7, from about 6.2 to about 8.5, or from 7.0 to 8.0. In some embodiments, the pH is less than about 9.2, less than about 8.7, or less than about 8.5. Alternatively, or in addition to, the pH is more than about 6.0, more than about 6.2, or more than about 6.5. In some embodiments, the pH is about 6.2, about 6.5, about 6.7, about 7.0, about 7.2, about 7.5, about 7.7, about 8.0, about 8.2, about 8.5, or is about 9.2.

The pH-adjusting agent may be present at a specific concentration range, regardless of pH. For example, in some embodiments, the amount of pH-adjusting agent is in a range from about 0.01 wt % to about 1 wt %, from about 0.02 wt % to about 0.5%, or from about 0.03 wt % to about 0.1 wt %. In some embodiments, the amount of pH-adjusting agent is in the from about 0.001 wt % to about 0.01 wt %, from about 0.001 wt % to about 0.008 wt %, from about 0.001 wt % to about 0.005 wt %, from about 0.001 wt % to about 0.003 wt %, or 0.002 wt %. In some embodiments, the amount of pH-adjusting agent is present in an amount of at least about 0.001 wt %, at least about 0.002 wt %, at least about 0.003 wt %, at least about 0.004 wt %, at least about 0.005 wt %, at least about 0.05 wt %, or at least about 0.5 wt %. In some embodiments, the pH-adjusting agent is present in an amount of less than about 1 wt %, less than about 0.1 wt %, less than about 0.01 wt %, or less than about 0.005 wt %. In some embodiments, the pH-adjusting agent is present in an amount that is about 0.002 wt %.

5. Water

In an embodiment, the polishing compositions disclosed herein contain a carrier, medium, or vehicle. In an embodiment, the carrier, medium, or vehicle is water. Ion exchanged water (deionized water), pure water, ultrapure water, distilled water and the like may be used as the water. In order to reduce the amount of unwanted components present in the water, the purity of water may be increased by operations such as removal of impurity ions with an ion exchange resin, removal of contaminants with a filter, and/or distillation In some embodiments, the water is relatively free of impurities. In some embodiments, the water contains less than about 10% w/w, about 9% w/w, about 8% w/w, about 7% w/w, about 6% w/w, about 5% w/w, about 4% w/w, about 3% w/w, about 2% w/w, about 1% w/w, about 0.9% w/w, about 0.8% w/w, about 0.7% w/w, about 0.6% w/w, about 0.5% w/w, about 0.4% w/w, about 0.3% w/w, or less than about 0.1% w/w of impurities based on the total weight of the water.

6. Additional Components

In an embodiment, the polishing compositions disclosed herein may contain additional components such as chelating agents, biocides, surfactants, or co-solvents. Additionally, or alternatively, the compositions disclosed herein can include other additives as will be understood by those skilled in the art.

In an embodiment, the additional component may include a chelating agent. The term chelating agent is intended to mean any substance that in the presence of an aqueous solution chelates metals, such as copper. Non-limiting examples of chelating agents include inorganic acids, organic acids, amines, and amino acids such as glycine, alanine, citric acid, acetic acid, maleic acid, oxalic acid, malonic acid, phthalic acid, succinic acid, nitrilotriacetic acid, iminodiacetic acid, ethylenediamine, CDTA, and EDTA.

In an embodiment, the additional component may be a biocide. Non-limiting examples of biocides include hydrogen peroxide, quaternary ammonium compounds, and chlorine compounds. More specific examples of the quaternary ammonium compounds include, but are not limited to, methylisothiazolinone, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms. More specific examples of the chlorine compounds include, but are not limited to, sodium chlorite and sodium hypochlorite. Additional examples of biocides include biguanide, aldehydes, ethylene oxide, isothiazolinone, iodophor, Kordek™ MLX from DuPont (which is an aqueous composition of 2-methyl-4-isothiazolin-3-one), KATHON™ and NEOLENE™ product families that are commercially available from Dow chemicals, and the Preventol™ family from Lanxess. In an embodiment, the biocide is Kordek™ MLX. The amount of biocide used in the polishing composition may range from about 0.00005 wt % to 0.001 wt % or from about 0.0001 wt % to 0.0005 wt %. In some embodiments, the biocide is present in an amount about 0.0001 wt %, about 0.00013 wt %, or about 0.00015 wt %.

In another embodiment, the additional component may include a surfactant. The surfactants may be anionic, cationic, nonionic, or zwitterionic and may increase lubricity of the vehicle or compositions. Non-limiting examples of the surfactants are dodecyl sulfates, sodium salts or potassium salts, lauryl sulfates, secondary alkane sulfonates, alcohol ethoxylate, acetylenic diol surfactant, quaternary ammonium-based surfactants, amphoteric surfactants, such as betaines and amino acid derivatives-based surfactants, and any combination thereof. Examples of suitable commercially available surfactants include TRITON™, TERGITOL™, and the DOWFAX™ family of surfactants manufactured by Dow Chemicals. Suitable surfactants of surfactants may also include polymers comprising ethylene oxide (EO) and propylene oxide (PO) groups. An example of EO-PO polymer is TETRONIC™ 90R4 from BASF Chemicals. The amount of surfactant used in the polishing composition may range from about 0.0005 wt % to 0.15 wt %, preferably from 0.001 wt % to 0.05 wt %, and more preferably from 0.0025 wt % to 0.025 wt %.

In another embodiment, the additional component may include another solvent, termed a co-solvent. Non-limiting examples of co-solvents include, but are not limited to, alcohol (such as methanol or ethanol), ethyl acetate, tetrahydrofuran, alkanes, tetrahydrofuran, dimethylformamide, toluene, ketones (such as acetone), aldehydes, and esters. Other non-limiting examples of co-solvents include dimethyl formamide, dimethyl sulfoxide, pyridine, acetonitrile, glycols, and mixtures thereof. The co-solvent may be employed in various amounts, preferably from a lower limit of about 0.0001, 0.001, 0.01, 0.1, 0.5, 1, 5, or 10% (wt %) to an upper limit of about 0.001, 0.01, 0.1, 1, 5, 10, 15, 20, 25, or 35% (wt %).

As described herein, the polishing compositions have specific properties, which are greatly influenced by the components in the composition, both in type and amount. Thus, certain materials may need to be excluded from the composition in order to maintain the desired properties.

The polishing slurries of the invention can be prepared by any suitable technique, many of which are known to those skilled in the art. The polishing composition can be prepared in a batch or a continuous process. Generally, the polishing composition can be prepared by combining the components disclosed herein in any order. The term "component" as used herein includes individual ingredients (e.g., abrasive, molybdenum removal rate enhancer, oxidizer, organic acid, corrosion inhibitor, and the like), as well as any combination of ingredients. For example, the abrasive can be dispersed in water, the molybdenum removal rate enhancer, and any other additive material can be added, and mixed by any method that is capable of incorporating the components into the polishing composition. The pH can be further adjusted, if desired, at any suitable time by addition of an acid, base or a buffer, as needed.

Accordingly, the polishing compositions described herein have specific properties exemplified by their performance in Mo removal rate, Mo etching rate, W removal rate, W etching rate, TEOS removal rate, or SiN removal rate.

For the polishing compositions disclosed herein, the polishing compositions have a molybdenum (Mo) removal rate of at least ≥about 100 Å/min; at least ≥about 200 Å/min; at least ≥about 300 Å/min; at least ≥about 400 Å/min; at least ≥about 500 Å/min; at least ≥about 600 Å/min; at least ≥about 650 Å/min; at least ≥about 700 Å/min; at least ≥about 750 Å/min; at least ≥about 800 Å/min; or at least ≥about 850 Å/min. In some embodiments, the Mo removal rate is in a range from about 100 Å/min to about 950 Å/min; from about 560 Å/min to about 950 Å/min; from about 600 Å/min to about 950 Å/min; from about 650 Å/min to about 950 Å/min; from about 700 Å/min to about 900 Å/min; from about 750 Å/min to about 900 Å/min; from about 750 Å/min to about 850 Å/min; or from about 800 Å/min to about 850 Å/min. In some embodiments, the Mo removal rate in a range from about 810 Å/min to about 920 Å/min.

For the polishing compositions disclosed herein, the polishing compositions have a tungsten (W) removal rate of at least ≥about 100 Å/min; at least ≥about 300 Å/min, at least ≥about 350 Å/min, at least ≥about 400 Å/min, at least ≥about 450 Å/min, at least ≥about 500 Å/min, at least ≥about 550 Å/min, or at least ≥about 600. In some embodiments, the W removal rate is in a range from about 100 Å/min to about 650 Å/min; from about 300 Å/min to about 625 Å/min; from about 400 Å/min to about 625 Å/min; from about 500 Å/min to about 625 Å/min; from about 550 Å/min to about 625 Å/min; or from about 575 Å/min to about 625 Å/min. In some embodiments, the W removal rate in a range from about 550 Å/min to about 650 Å/min.

For the polishing compositions disclosed herein, the polishing compositions have a TEOS removal rate of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the TEOS removal rate is in a range from about 1 Å/min to about 15 Å/min; from about 2 Å/min to about 9 Å/min; from about 4 Å/min to about 8 Å/min; or from about 6 Å/min to about 8 Å/min. In some embodiments, the SiN removal rate is about 10 Å/min, about 9 Å/min, about 8 Å/min, about 7 Å/min, about 6 Å/min, about 5 Å/min, about 4 Å/min, about 3 Å/min, or about 2 Å/min.

For the polishing compositions disclosed herein, the polishing compositions have a SiN removal rate of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the SiN removal rate is in a range from about 1 Å/min to about 10 Å/min; from about 2 Å/min to about 6 Å/min; from about 2 Å/min to about 5 Å/min; or from about 2 Å/min to about 4 Å/min. In some embodiments, the SiN removal rate is about 10 Å/min, about 9 Å/min, about 8 Å/min, about 7 Å/min, about 6 Å/min, about 5 Å/min, about 4 Å/min, about 3 Å/min, or about 2 Å/min.

For the polishing compositions disclosed herein, the polishing compositions have a Mo:TEOS removal rate ratio of greater than about 50, about 80, about 85, about 90, about 95, about 100, about 110, about 115, about 120, or about 130. In some embodiments, the Mo:TEOS removal rate ratio is in a range from about 50 to about 150, from about 80 to about 135, from about 85 to about 135, from about 95 to about 132, from about 97 to about 120, or from about 97 to about 105. In some embodiments, the Mo:TEOS removal rate ratio is in a range from about 95 to about 117. In some embodiments, the Mo:TEOS removal rate ratio is in a range from about 100 to about 132. In some embodiments, the Mo:TEOS removal rate ratio is in a range from about 115 to about 132. In some embodiments, the Mo:TEOS removal rate ratio is in a range from about 100 to about 117

For the polishing compositions disclosed herein, the polishing compositions have a W:TEOS removal rate ratio of greater than about 40, about 50, about 55, about 60, about 65, about 70, about 75, about 80, or about 100. In some embodiments, the W:TEOS removal rate ratio is in a range from about 40 to about 100, from about 50 to about 95, from about 60 to about 95, from about 65 to about 95, from about 70 to about 95, from about 75 to about 95, from about 80 to about 95, or from about 90 to about 95. In some embodiments, the W:TEOS removal rate ratio is in a range from about 70 to about 85, from about 75 to about 85. In some embodiments, the W:TEOS removal rate ratio is in a range from about 65 to about 75 or from about 72 to about 82.

For the polishing compositions disclosed herein, the polishing compositions have a Mo:SiN removal rate ratio of greater than about 100, about 150, about 160, about 170, about 180, about 190, about 200, about 225, about 250, about 275, or about 300. In some embodiments, the Mo:SiN removal rate ratio is in a range from about 100 to about 320, from about 100 to about 305, from about 100 to about 280, from about 150 to about 275, from about 175 to about 225, or from about 200 to about 210.

For the polishing compositions disclosed herein, the polishing compositions have a W:SiN removal rate ratio of greater than about 50, about 75, about 90, about 95, about 125, about 135, about 140, about 145, about 150, or about 155. In some embodiments, the T:SiN removal rate ratio is in a range from about 75 to about 150, from about 95 to about 150, from about 125 to about 150, from about 135 to about 150, from about 140 to about 150, or from about 145 to about 150.

For the polishing compositions disclosed herein, the polishing compositions have a Mo etching rate (ER) of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the Mo etching rate is in a range from about 1 Å/min to about 10 Å/min; from about 2 Å/min to about 9 Å/min; from about 3 Å/min to about 8 Å/min; or from about 4 Å/min to about 6 Å/min. In some embodiments, the Mo etching rate is about 10 Å/min, about 9 Å/min, about 8 Å/min, about 7 Å/min, about 6 Å/min, about 5 Å/min, about 4 Å/min, about 3 Å/min, or about 2 Å/min.

For the polishing compositions disclosed herein, the polishing compositions have a W etching rate (ER) of less than about 11 Å/min, less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the W etching rate is in a range from about 1 Å/min to about 11 Å/min; from about 2 Å/min to about 9 Å/min; from about 2 Å/min to about 6 Å/min; or from about 2 Å/min to about 4 Å/min. In some embodiments, the W etching rate is about 10 Å/min, about 9 Å/min, about 8 Å/min, about 7 Å/min, about 6 Å/min, about 5 Å/min, about 4 Å/min, about 3 Å/min, or about 2 Å/min.

For the polishing compositions disclosed herein, the polishing compositions have a Mo (RR):Mo (RE) ratio of greater than about 50, about 70, about 90, about 95, about 125, about 135, about 140, about 145, about 150, or about 155. In some embodiments, the Mo (RR):Mo (RE) ratio is in a range from about 70 to about 185, from about 70 to about 160, from about 70 to about 150, from about 95 to about 155, from about 135 to about 155, from about 135 to about 150, from about 140 to about 150, or from about 145 to about 150.

For the polishing compositions disclosed herein, the polishing compositions have a W (RR):W (RE) ratio of greater than about 50, about 80, about 100, about 125, about 150, about 175, about 200, about 220, about 250, or about 280. In some embodiments, the W (RR):W (RE) ratio is in a range from about 80 to about 300, from about 150 to about 280, from about 200 to about 280, from about 220 to about 280, from about 250 to about 280, or from about 260 to about 280.

Accordingly, as described herein, in some embodiments are polishing compositions comprising an abrasive, a molybdenum etching inhibitor, an oxidizer, and water, wherein
the abrasive is colloidal silica with a mean particle size ranging from about 30 to about 75 nm and a silanol density on the silica surface of from about 1.3 unit/nm$^2$ to about 6.0 unit/nm$^2$
the molybdenum etching inhibitor is a zwitterionic surfactant having a structure of formula (I):

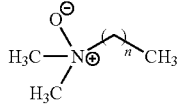

Formula (I)

wherein n is an integer selected from 8, 9, 10, 11, 12, 13, and 14; and
the oxidizer is a peroxide;
wherein the polishing composition has a pH from about 6.5 to about 8.5.

As in any embodiment above, the polishing composition wherein the peroxide is hydrogen peroxide.

As in any embodiment above, the polishing composition wherein the mean particle size ranges from about 30 to about 50 nm.

As in any embodiment above, the polishing composition wherein the mean particle size ranges from about 32 to about 49 nm.

As in any embodiment above, the polishing composition wherein the mean particle size is 44 nm.

As in any embodiment above, the polishing composition wherein the mean particle size is 48 nm.

As in any embodiment above, the polishing composition wherein the silanol density ranges from about 1 to about 2 units/nm$^2$.

As in any embodiment above, the polishing composition wherein the silanol density is 1.4 units/nm$^2$.

As in any embodiment above, the polishing composition wherein the silanol density is 5.5 units/nm$^2$.

As in any embodiment above, the polishing composition wherein the oxidizer is present in a concentration of about 0.1 wt % to about 1.5 wt %.

As in any embodiment above, the polishing composition wherein the oxidizer is present in a concentration of about 0.1 wt %.

As in any embodiment above, a polishing composition wherein the pH is from about 7.0 to about 8.0.

As in any embodiment above, a polishing composition wherein the pH is 7.5.

As in any embodiment above, a polishing composition further comprising a pH-adjusting agent.

As in any embodiment above, a polishing composition wherein the pH-adjusting agent is a base present in a concentration from about 0.001 wt % to about 0.01 wt %.

As in any embodiment above, a polishing composition wherein the pH-adjusting agent is an alkali metal hydroxide.

As in any embodiment above, a polishing composition wherein the alkali hydroxide is potassium hydroxide.

As in any embodiment above, a polishing composition wherein integer n in formula (I) of the zwitterionic surfactant is selected from 8, 10, and 12.

As in any embodiment above, a polishing composition wherein integer n in formula (I) of the zwitterionic surfactant is 12.

As in any embodiment above, a polishing composition wherein the molybdenum etching inhibitor is present in a concentration from about 0.01 wt % to about 0.1 wt %.

As in any embodiment above, a polishing composition wherein the polishing composition has a molybdenum etching rate of less than about 10.

As in any embodiment above, a polishing composition wherein the polishing composition has a molybdenum removal rate of at least about 100 Å/min.

As in any embodiment above, a polishing composition wherein the polishing composition has a ratio of molybdenum removal rate to molybdenum static etch rate of greater than about 50.

As in any embodiment above, a polishing composition wherein the polishing composition has a Mo:TEOS removal rate selectivity of at greater than about 50.

As in any embodiment above, a polishing composition wherein the polishing composition has a Mo:SiN removal rate selectivity of at greater than about 100.

As in any embodiment above, a polishing composition which does not comprise an iron salt. In a further embodiment, the polishing composition does not comprise a divalent or trivalent iron, such as iron (II) sulfate (FeSO$_4$), iron (III) sulfate (Fe$_2$(SO$_4$)$_3$), or iron (III) nitrate (Fe(NO$_3$)$_3$).

As in any embodiment above, a polishing composition wherein the polishing composition is stable for a period of at least one week. In an embodiment, the pH of the composition remains unchanged after a period of at least one week. In another embodiment, the electrical conductivity (EC) of the composition remains unchanged after a period of at least one week. In some embodiments, the electrical conductivity is from greater than zero to about 1.0 mS/cm, from greater than zero to about 0.50 mS/cm, from greater than zero to about 0.25 mS/cm, from greater than zero to about 0.15 mS/cm, from greater than zero to about 0.10 mS/cm, from greater than zero to about 0.05 mS/cm, or from greater than zero to about 0.03 mS/cm. In some embodiments, the electrical conductivity is from about 0.01 mS/cm to about 1.0 mS/cm, from about 0.02 mS/cm to about 0.50 mS/cm, or from about 0.03 mS/cm to about 0.1 mS/cm. In some embodiments, the electrical conductivity is about 0.02, 0.03, 0.04, 0.05, 0.06, 0.07, 0.08, 0.09, 0.10, 0.11, 0.12, 0.13, 0.14, or 0.15 mS/cm. In some embodiments, the upper limit of the electrical conductivity is about 0.25 mS/cm, about 0.20 mS/cm, about 0.18 mS/cm, about 0.16 mS/cm, about 0.14 mS/cm, about 0.12 mS/cm, about 0.10 mS/cm, about 0.08 mS/cm, about 0.07 mS/cm, about 0.06 mS/cm, about 0.05 mS/cm, about 0.04 mS/cm, or about 0.03 mS/cm. In a further embodiment, the electrical conductivity is in the range from about 0.2 mS/cm to about 1.0 mS/cm.

Further, in some embodiments are a polishing composition comprising an abrasive, a molybdenum etching inhibitor, an oxidizer, and water, wherein the abrasive is colloidal silica with a mean particle size ranging from about 30 to about 75 nm and a silanol density on the silica surface is from about 1.3 unit/nm$^2$ to about 6.0 unit/nm$^2$ present in a concentration of from about 0.1 wt % to about 5 wt %;
the molybdenum etching inhibitor is a zwitterionic surfactant having a structure of formula (I):

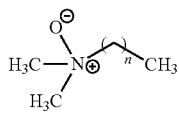
Formula (I)

wherein n is an integer selected from 8, 9, 10, 11, 12, 13, and 14 present in a concentration of from about 0.01 wt % to about 0.1 wt %; and the oxidizer is a peroxide present in a concentration of from about 0.1 wt % to about 5 wt %; wherein the polishing composition has a pH from about 6.5 to about 8.5.

As in any embodiment above, a polishing composition wherein n in formula (1) is 12.

As in any embodiment above, a polishing composition further comprising a pH-adjusting agent present in a concentration from about 0.001 wt % to about 0.01 wt %.

As in any embodiment above, a polishing composition wherein the pH-adjusting agent is potassium hydroxide.

C. Methods of Using the Polishing Compositions

The polishing compositions described herein are useful for polishing any suitable substrate. In an embodiment, the substrate to be polished can be any suitable substrate, which comprises at least one layer of molybdenum. Suitable substrates include, but are not limited to, flat panel displays, integrated circuits, memory or rigid disks, metals, interlayer dielectric (ILD) devices, semiconductors, microelectromechanical systems, ferroelectrics, and magnetic heads.

As another example, the polishing composition can be used to polish a substrate, which comprises at least one layer of tungsten. Suitable substrates include, but are not limited to, electron emitters, electrical contact materials, integrated circuits, and microelectronic devices.

As another example, the polishing composition can be used to polish a substrate comprising a silicon oxide layer. In another embodiment, the polishing composition can be used to polish a substrate comprising a silicon layer. Suitable substrates include, but are not limited to, flat panel displays, integrated circuits, memory or rigid disks, metals, semiconductors, ILD devices, microelectromechanical systems (MEMS), ferroelectrics, and magnetic heads.

The substrate can further comprise at least one other layer, e.g., an insulating layer. The insulating layer can be a metal oxide, porous metal oxide, glass, organic polymer, fluorinated organic polymer, or any other suitable high- or low-K insulating layer. The insulating layer can comprise, consist essentially of, or consist of silicon oxide, SiN, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin-on dielectric (SOD) oxide, chemical vapor deposition (CVD) oxide, plasma-enhanced tetraethyl orthosilicate (PETEOS), thermal oxide, or undoped silicate glass. In a specific embodiment, the silicon oxide layer is tetraethoxysilane (TEOS). The substrate can further comprise a metal layer. In a specific embodiment, the metal layer is molybdenum. In another specific embodiment, the metal layer is tungsten.

The subject matter disclosed herein also comprises a method for polishing a substrate with the polishing compositions described herein. The method of polishing a substrate comprises: (a) providing a substrate, (b) providing a polishing composition described herein, (c) applying the polishing composition to at least a portion of the substrate, and (d) abrading at least a portion of the substrate with the polishing composition to polish the substrate.

In the method of polishing a substrate, the polishing compositions disclosed herein have a molybdenum (Mo) removal rate of at least ≥about 100 Å/min; at least ≥about 200 Å/min; at least ≥about 300 Å/min; at least ≥about 400 Å/min; at least ≥about 500 Å/min; at least ≥about 600 Å/min; at least ≥about 650 Å/min; at least ≥about 700 Å/min; at least ≥about 750 Å/min; at least ≥about 800 Å/min; or at least ≥about 850 Å/min. In some embodiments, the Mo removal rate is in a range from about 100 Å/min to about 950 Å/min; from about 560 Å/min to about 950 Å/min; from about 600 Å/min to about 950 Å/min; from about 650 Å/min to about 950 Å/min; from about 700 Å/min to about 900 Å/min; from about 750 Å/min to about 900 Å/min; from about 750 Å/min to about 850 Å/min; or from about 800 Å/min to about 850 Å/min. In some embodiments, the Mo removal rate in a range from about 810 Å/min to about 920 Å/min.

In the method of polishing a substrate, the polishing compositions disclosed herein have a tungsten (W) removal rate of at least ≥about 100 Å/min; at least ≥about 300 Å/min, at least ≥about 350 Å/min, at least ≥about 400 Å/min, at least ≥about 450 Å/min, at least ≥about 500 Å/min, at least ≥about 550 Å/min, or at least ≥about 600. In some embodiments, the W removal rate is in a range from about 100 Å/min to about 650 Å/min; from about 300 Å/min to about 625 Å/min; from about 400 Å/min to about 625 Å/min; from about 500 Å/min to about 625 Å/min; from about 550 Å/min to about 625 Å/min; or from about 575 Å/min to about 625 Å/min. In some embodiments, the W removal rate in a range from about 550 Å/min to about 650 Å/min.

In the method of polishing a substrate, the polishing compositions disclosed herein have a TEOS removal rate of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the TEOS removal rate is in a range from about 1 Å/min to about 15 Å/min; from about 2 Å/min to about 9 Å/min; from about 4 Å/min to about 8 Å/min; or from about 6 Å/min to about 8 Å/min. In some embodiments, the SiN removal rate is about 10 Å/min, about 9 Å/min, about 8 Å/min, about 7 Å/min, about 6 Å/min, about 5 Å/min, about 4 Å/min, about 3 Å/min, or about 2 Å/min.

In the method of polishing a substrate, the polishing compositions disclosed herein have a SiN removal rate of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the SiN removal rate is in a range from about 1 Å/min to about 10 Å/min; from about 2 Å/min to about 6 Å/min; from about 2 Å/min to about 5 Å/min; or from about 2 Å/min to about 4 Å/min. In some embodiments, the SiN removal rate is about 10 Å/min, about 9 Å/min, about 8 Å/min, about 7 Å/min, about 6 Å/min, about 5 Å/min, about 4 Å/min, about 3 Å/min, or about 2 Å/min.

In the method of polishing a substrate, the polishing compositions disclosed herein have a Mo:TEOS removal rate ratio of greater than about 50, about 80, about 85, about 90, about 95, about 100, about 110, about 115, about 120, or about 130. In some embodiments, the Mo:TEOS removal rate ratio is in a range from about 50 to about 150, from about 80 to about 135, from about 85 to about 135, from about 95 to about 132, from about 97 to about 120, or from about 97 to about 105. In some embodiments, the Mo:TEOS removal rate ratio is in a range from about 95 to about 117. In some embodiments, the Mo:TEOS removal rate ratio is in a range from about 100 to about 132. In some embodiments, the Mo:TEOS removal rate ratio is in a range from about 115 to about 132. In some embodiments, the Mo:TEOS removal rate ratio is in a range from about 100 to about 117

In the method of polishing a substrate, the polishing compositions disclosed herein have a W:TEOS removal rate ratio of greater than about 40, about 50, about 55, about 60, about 65, about 70, about 75, about 80, or about 100. In some embodiments, the W:TEOS removal rate ratio is in a range from about 40 to about 100, from about 50 to about 95, from about 60 to about 95, from about 65 to about 95, from about 70 to about 95, from about 75 to about 95, from about 80 to about 95, or from about 90 to about 95. In some embodiments, the W:TEOS removal rate ratio is in a range from about 70 to about 85, from about 75 to about 85. In some embodiments, the W:TEOS removal rate ratio is in a range from about 65 to about 75 or from about 72 to about 82.

In the method of polishing a substrate, the polishing compositions disclosed herein have a Mo:SiN removal rate ratio of greater than about 100, about 150, about 160, about 170, about 180, about 190, about 200, about 225, about 250, about 275, or about 300. In some embodiments, the Mo:SiN removal rate ratio is in a range from about 100 to about 320, from about 100 to about 305, from about 100 to about 280, from about 150 to about 275, from about 175 to about 225, or from about 200 to about 210.

In the method of polishing a substrate, the polishing compositions disclosed herein have a W:SiN removal rate ratio of greater than about 50, about 75, about 90, about 95, about 125, about 135, about 140, about 145, about 150, or about 155. In some embodiments, the T:SiN removal rate ratio is in a range from about 75 to about 150, from about 95 to about 150, from about 125 to about 150, from about 135 to about 150, from about 140 to about 150, or from about 145 to about 150.

In the method of polishing a substrate, the polishing compositions disclosed herein have a Mo etching rate (ER) of less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the Mo etching rate is in a range from about 1 Å/min to about 10 Å/min; from about 2 Å/min to about 9 Å/min; from about 3 Å/min to about 8 Å/min; or from about 4 Å/min to about 6 Å/min. In some embodiments, the Mo etching rate is about 10 Å/min, about 9 Å/min, about 8 Å/min, about 7 Å/min, about 6 Å/min, about 5 Å/min, about 4 Å/min, about 3 Å/min, or about 2 Å/min.

In the method of polishing a substrate, the polishing compositions disclosed herein have a W etching rate (ER) of less than about 11 Å/min, less than about 10 Å/min; less than about 9 Å/min; less than about 8 Å/min; less than about 7 Å/min; less than about 6 Å/min; less than about 5 Å/min; less than about 4 Å/min; less than about 3 Å/min; or less than about 2 Å/min. In some embodiments, the W etching rate is in a range from about 1 Å/min to about 11 Å/min; from about 2 Å/min to about 9 Å/min; from about 2 Å/min to about 6 Å/min; or from about 2 Å/min to about 4 Å/min. In some embodiments, the W etching rate is about 10 Å/min, about 9 Å/min, about 8 Å/min, about 7 Å/min, about 6 Å/min, about 5 Å/min, about 4 Å/min, about 3 Å/min, or about 2 Å/min.

In the method of polishing a substrate, the polishing compositions disclosed herein have a Mo (RR):Mo (RE) ratio of greater than about 50, about 70, about 90, about 95, about 125, about 135, about 140, about 145, about 150, or about 155. In some embodiments, the Mo (RR):Mo (RE) ratio is in a range from about 70 to about 185, from about 70 to about 160, from about 70 to about 150, from about 95 to about 155, from about 135 to about 155, from about 135 to about 150, from about 140 to about 150, or from about 145 to about 150.

In the method of polishing a substrate, the polishing compositions disclosed herein have a W (RR):W (RE) ratio of greater than about 50, about 80, about 100, about 125, about 150, about 175, about 200, about 220, about 250, or about 280. In some embodiments, the W (RR):W (RE) ratio is in a range from about 80 to about 300, from about 150 to about 280, from about 200 to about 280, from about 220 to about 280, from about 250 to about 280, or from about 260 to about 280.

Accordingly, as described herein, in some embodiments are methods of using the polishing compositions, where the methods comprise the steps of: a) providing the polishing composition described herein; b) providing a substrate, wherein the substrate comprises a molybdenum (Mo) containing layer; and c) polishing the substrate with the polishing composition to provide a polished substrate.

As in any embodiment above, a method wherein the substrate is a semiconductor.

As in any embodiment above, a method wherein the Mo removal rate (RR) is at least ≥about 100 Å/min.

As in any embodiment above, a method wherein the substrate further comprises a silicon oxide layer (TEOS).

As in any embodiment above, a method wherein the method results in a Mo:TEOS removal rate selectivity ratio of greater than about 50.

As in any embodiment above, a method wherein the method results in a Mo etching rate (ER) of less than about 10.

As in any embodiment above, a method wherein the method results in Mo (RR):Mo (RE) ratio of greater than about 50.

As in any above embodiment, a method wherein the substrate further comprises a silicon nitride layer (SiN).

As in any above embodiment, a method wherein the method results in a Mo:SiN removal rate selectivity ratio of greater than about 100.

In another aspect of the invention, as described herein, in some embodiments are methods of using the polishing compositions, where the methods comprise the steps of: a) providing the polishing composition described herein; b) providing a substrate, wherein the substrate comprises a tungsten (W) containing layer; and c) polishing the substrate with the polishing composition to provide a polished substrate.

As in any embodiment above, a method wherein the substrate is an electrical contact materials.

As in any above embodiment, a method wherein the W removal rate (RR) is at least ≥about 100 Å/min.

As in any embodiment above, a method wherein the substrate further comprises a silicon oxide layer (TEOS).

As in any embodiment above, a method wherein the method results in a W:TEOS removal rate selectivity ratio of greater than about 40.

As in any embodiment above, a method wherein the method results in a W etching rate (ER) of less than about 10.

As in any embodiment above, a method wherein the method results in W (RR):W (RE) ratio of greater than about 50.

As in any above embodiment, a method wherein the substrate further comprises a silicon nitride layer (SiN).

As in any above embodiment, a method wherein the method results in a W:SiN removal rate selectivity ratio of greater than 50.

D. Examples

The following preparations and examples are given to enable those skilled in the art to more clearly understand and to practice the present invention. They should not be considered as limiting the scope of the invention, but merely as being illustrative and representative.

In one aspect, disclosed are methods of making the polishing compositions. In another aspect are disclosed methods of using the polishing compositions to polish materials.

Example 1: Polishing Conditions

Materials and tools used:
Polishing conditions
200 mm Polisher Westech
Platen rotation speed: 110 rpm
Head rotation speed: 103 rpm
Flow rate: 100 mL/min
Down force: 2 psi
Polishing time: 60 sec
Pad: medium hard pad
Dilution factor: 1×
1.0% $H_2O_2$
Conditions for etch rate:
25° C. for 3 min
Mo or W coupon size: 1.5 in×1.5 in
Instrumentation:
Westech (200 mm polisher), Polishing pad: IC1010, Pad conditioner: 3M A165
Polishing recipe:
Down force: 2.0 psi,
rotation: 110/103 rpm,
slurry flow rate: 100 mL/min,
Polishing time: 60 sec Example 2: Evaluation of Various Polishing Compositions For this study several abrasives A-G were investigated differing in their primary particle size, mean particle size and silanol (SiOH) density, which are summarized in Table 1 below:

TABLE A

| Abrasive information | | | |
|---|---|---|---|
| | Primary Particle size [nm] | Mean particle size [nm] | SiOH density [unit/nm2] |
| Abrasive-A | 30 | 70 | 5.7 |
| Abrasive-B | 23 | 44 | 5.5 |
| Abrasive-C | 37 | 76 | 1.6 |
| Abrasive-D | 25 | 48 | 1.4 |
| Abrasive-E | 12 | 33 | 1.4 |
| Abrasive-F | 92 | 118 | 7.4 |
| Abrasive-G | 12 | 31 | 5.7 |

In addition, a series of various molybdenum etching inhibitors were examined as well. Note that inhibitors A, B, C, and D are zwitterionic surfactants, whereas inhibitors E (and G), F and H are amines, carboxylic acids and sulfates, respectively. Table B shows all of the inhibitors used.

TABLE B

| Inhibitor Information | | |
|---|---|---|
| Inhibitor | chemical name | Number of carbon chain |
| A | Octyl amine oxide | 8 |
| B | Decyl amine oxide | 10 |
| C | Dodecyl amine oxide | 12 |
| D | Lauryl amine oxide | 14 |
| E | Laurylamine | 12 |
| F | Lauric acid | 12 |
| G | N,N-Dimethyllaurylamine | 12 |
| H | Lauryl sulfate | 12 |

As is illustrated in Table 1, Slurries 1-7 were screened as corrosion inhibitors for Mo and W. Additional data for TEOS and SiN were also obtained. The Mo and W removal rates (RR) were determined. Generally, slurries with high RR for Mo and/or W were desirable. The data in Table 1 shows that Slurry-02 and Slurry-03 gave higher Mo RR and higher W RR compared to the other slurries (i.e., Slurry-01, Slurry-04, Slurry-05, Slurry-06, and Slurry-07). In particular, Slurry-04 having Abrasive-D produced the highest Mo and W RRs. These results demonstrate that even abrasives with a low silanol (SiOH) density can provide slurries that exhibit high Mo and/or Wo RRs.

TABLE 1

| Effect of abrasive type | | | | | | | | | | |
|---|---|---|---|---|---|---|---|---|---|---|
| Slurry name | Abrasive type | conc. | pH adjuster | Mo inhibitor type | conc. | pH | Oxidizer conc. | Mo | W | TEOS | SiN |
| Slurry-01 | A | 2 | KOH | C | 0.05 | 7.5 | 0.1 | 384 | 311 | 11 | 6 |
| Slurry-02 | B | 2 | KOH | C | 0.05 | 7.5 | 0.1 | 812 | 588 | 8 | 4 |

TABLE 1-continued

Effect of abrasive type

| Slurry name | Abrasive type | conc. | pH adjuster | Mo inhibitor type | conc. | pH | Oxidizer conc. | RR Mo | W | TEOS | SiN |
|---|---|---|---|---|---|---|---|---|---|---|---|
| Slurry-03 | C | 2 | KOH | C | 0.05 | 7.5 | 0.1 | 521 | 421 | 12 | 7 |
| Slurry-04 | D | 2 | KOH | C | 0.05 | 7.5 | 0.1 | 912 | 624 | 9 | 3 |
| Slurry-05 | E | 2 | KOH | C | 0.05 | 7.5 | 0.1 | 512 | 112 | 7 | 5 |
| Slurry-06 | F | 2 | KOH | C | 0.05 | 7.5 | 0.1 | 316 | 382 | 9 | 5 |
| Slurry-07 | G | 2 | KOH | C | 0.05 | 7.5 | 0.1 | 225 | 108 | 6 | 3 |

Next, several slurries were prepared to investigate the effects if the type of Mo etching inhibitor that is present in the polishing composition on its corrosion properties. As is illustrated in Table-2 below, slurries (such as Slurry-02, Slurry-09, Slurry-10, Slurry-11, Slurry-16, Slurry-17, Slurry-18, Slurry-19) with zwitterionic surfactants (such as inhibitors A, B, C and D) were able to reduce the Mo and W etching rates (ERs), while maintaining high Mo and W RRs. By contrast, slurries (such as Slurry-13 and Slurry-15) with anionic Mo etching inhibitors such as H an F reduced both Mo and W removal rates. Similar results were observed with slurries (such as Slurry-12 and Slurry-14) having cationic Mo etching inhibitors E and G, which also exhibited reduced Mo and W removal rates.

With respect to the carbon chain length of the zwitterionic surfactant, Table 2 shows that Mo etching inhibitors with longer carbon chains generally exhibited a lower etching rate. Mo etching inhibitors that provide a high RR while at the same time a low etching rate were identified as having a carbon chain length of 8 to 12. Such inhibitors provided good selectivity for RR/ER.

TABLE 2

Effect of Inhibitor type

| Slurry name | Abrasive type | conc. | pH adjuster | Mo inhibitor type | conc. | pH | Oxidizer conc. | RR Mo | W | TEOS | SiN | ER Mo | W |
|---|---|---|---|---|---|---|---|---|---|---|---|---|---|
| Slurry-02 | B | 2 | KOH | C | 0.05 | 7.5 | 0.1 | 812 | 588 | 8 | 4 | 5.5 | 2.1 |
| Slurry-08 | B | 2 | KOH | — | — | 7.5 | 0.1 | 1234 | 642 | 8 | 4 | 34.5 | 10.9 |
| Slurry-09 | B | 2 | KOH | A | 0.05 | 7.5 | 0.1 | 818 | 589 | 8 | 4 | 5.7 | 2.5 |
| Slurry-10 | B | 2 | KOH | B | 0.05 | 7.5 | 0.1 | 818 | 578 | 7 | 4 | 5.9 | 2.6 |
| Slurry-11 | B | 2 | KOH | D | 0.05 | 7.5 | 0.1 | 791 | 555 | 6 | 4 | 5.2 | 2.1 |
| Slurry-12 | B | 2 | KOH | E | 0.05 | 7.5 | 0.1 | 21 | 18 | 3 | 2 | 5.4 | 2.8 |
| Slurry-13 | B | 2 | KOH | F | 0.05 | 7.5 | 0.1 | 298 | 98 | 6 | 4 | 5.5 | 3.4 |
| Slurry-14 | B | 2 | KOH | G | 0.05 | 7.5 | 0.1 | 165 | 111 | 7 | 4 | 11.1 | 5.8 |
| Slurry-15 | B | 2 | KOH | H | 0.05 | 7.5 | 0.1 | 11 | 16 | 6 | 4 | 12.1 | 3.4 |
| Slurry-16 | B | 2 | KOH | C | 0.15 | 7.5 | 0.1 | 777 | 512 | 8 | 4 | 4.2 | 2 |
| Slurry-17 | B | 2 | KOH | C | 0.5 | 7.5 | 0.1 | 598 | 391 | 7 | 4 | 3.8 | 1.8 |
| Slurry-18 | B | 2 | KOH | C | 0.01 | 7.5 | 0.1 | 900 | 601 | 8 | 4 | 6.1 | 2.7 |
| Slurry-19 | B | 2 | KOH | C | 0.001 | 7.5 | 0.1 | 1189 | 621 | 8 | 4 | 33.2 | 9.8 |

Next, a study was conducted to determine the effects of pH on the performance of Mo inhibition. As such, a series of slurries at varying pH were prepared using abrasive-B and Mo-inhibitor C. The results are shown in Table-3, which shows that when the pH ranges between 6.2 to 9.2 high W/Mo RR and low W/Mo etching rates were observed.

TABLE 3

Effect of slurry pH

| Slurry name | Abrasive type | conc. | pH adjuster | Mo inhibitor type | conc. | pH | Oxidizer conc. | RR Mo | W | TEOS | SiN | ER Mo | W |
|---|---|---|---|---|---|---|---|---|---|---|---|---|---|
| Slurry-02 | B | 2 | KOH | C | 0.05 | 7.5 | 0.1 | 812 | 588 | 8 | 4 | 5.5 | 2.1 |
| Slurry-20 | B | 2 | KOH | C | 0.05 | 8.6 | 0.1 | 822 | 421 | 7 | 3 | 5.5 | 2.4 |
| Slurry-21 | B | 2 | KOH | C | 0.05 | 9.2 | 0.1 | 698 | 399 | 8 | 4 | 9.8 | 4.5 |
| Slurry-22 | B | 2 | — | C | 0.05 | 10 | 0.1 | 326 | 218 | 8 | 4 | 45.3 | 37.4 |
| Slurry-23 | B | 2 | Nitric acid | C | 0.05 | 6.2 | 0.1 | 647 | 433 | 3 | 4 | 6.8 | 2.8 |
| Slurry-24 | B | 2 | Nitric acid | C | 0.05 | 3.8 | 0.1 | 213 | 222 | 2 | 1 | 12.1 | 9.3 |
| Slurry-25 | B | 2 | Nitric acid | C | 0.05 | 2.2 | 0.1 | 432 | 289 | 13 | 2 | 9.2 | 6.8 |

It will be apparent to those skilled in the art that various modifications and variations can be made in the present invention without departing from the scope or spirit of the invention. Other aspects of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A polishing composition comprising an abrasive, a molybdenum etching inhibitor, an oxidizer, and water, wherein
the abrasive is colloidal silica with a mean particle size ranging from about 30 to about 75 nm and a silanol density on the silica surface of from about 1.3 unit/nm² to about 6.0 unit/nm² the molybdenum etching inhibitor is a zwitterionic surfactant having a structure of formula (I):

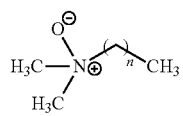

Formula (I)

wherein n is an integer selected from 8, 9, 10, 12, 13, and 14; and
the oxidizer is a peroxide;
wherein the polishing composition has a pH from about 6.5 to about 8.5.

2. The polishing composition of claim 1, wherein the peroxide is hydrogen peroxide.

3. The polishing composition of claim 1, wherein the mean particle size ranges from about 30 to about 50 nm.

4. The polishing composition of claim 1, wherein the silanol density ranges from about 1 to about 2 units/nm².

5. The polishing composition of claim 1, wherein the oxidizer is present in a concentration of about 0.1 wt % to about 1.5 wt %.

6. The polishing composition of claim 1, wherein the pH is from about 7.0 to about 8.0.

7. The polishing composition of claim 1, further comprising a pH-adjusting agent, wherein the pH-adjusting agent is an alkali metal hydroxide.

8. The polishing composition of claim 7, wherein the alkali metal hydroxide is potassium hydroxide.

9. The polishing composition of claim 1, wherein integer n in formula (I) of the zwitterionic surfactant is selected from 8, 10, and 12.

10. The polishing composition of claim 1, wherein the molybdenum etching inhibitor is present in a concentration from about 0.01 wt % to about 0.1 wt %.

11. A polishing composition comprising an abrasive, a molybdenum etching inhibitor, an oxidizer, and water, wherein
the abrasive is colloidal silica with a mean particle size ranging from about 30 to about 75 nm and a silanol density on the silica surface is from about 1.3 unit/nm² to about 6.0 unit/nm² present in a concentration of from about 0.1 wt % to about 5 wt %;
the molybdenum etching inhibitor is a zwitterionic surfactant having a structure of formula (I):

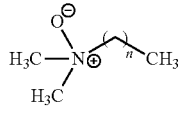

Formula (I)

wherein n is an integer selected from 8, 9, 10, 12, 13, and 14 present in a concentration of from about 0.01 wt % to about 0.1 wt %; and
the oxidizer is a peroxide present in a concentration of from about 0.1 wt % to about 5 wt %;
wherein the polishing composition has a pH from about 6.5 to about 8.5.

12. The polishing composition of claim 11, wherein n in formula (1) is 12.

13. The polishing composition of claim 11, wherein the pH-adjusting agent is a potassium hydroxide.

14. A method for polishing a substrate, the method comprising the steps of:
(a) providing the polishing composition of claim 1;
(b) providing a substrate, wherein the substrate comprises a molybdenum-containing layer; and (c) polishing the substrate with the polishing composition to provide a polished substrate.

15. The method of claim 14, wherein the method has a ratio of molybdenum removal rate to molybdenum etching rate of at least about 20.

16. The method of claim 14, wherein the substrate further comprises a silicon oxide layer.

17. The method of claim 16, wherein the method has a Mo:TEOS removal rate selectivity of greater than about 50.

18. The method of claim 14, wherein the substrate further comprises a silicon nitride layer.

19. The method of claim 18, wherein the method has a Mo:SiN removal rate selectivity of greater than about 100.

20. The method of claim 14, wherein the substrate is a semiconductor.

* * * * *